(12) United States Patent
Suzawa et al.

(10) Patent No.: US 6,559,478 B1
(45) Date of Patent: May 6, 2003

(54) SEMICONDUCTOR INTEGRATED CIRCUIT AND METHOD OF FABRICATING SAME

(75) Inventors: Hideomi Suzawa, Kanagawa (JP); Yasuhiko Takemura, Shiga-ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/291,292

(22) Filed: Apr. 14, 1999

Related U.S. Application Data

(62) Division of application No. 08/450,953, filed on May 23, 1995, now Pat. No. 5,914,498.

(30) Foreign Application Priority Data

May 26, 1994 (JP) .............................................. 6-137988

(51) Int. Cl.⁷ .............................................. H01L 29/76
(52) U.S. Cl. ........................ 257/66; 257/900; 257/350; 257/408
(58) Field of Search .......................... 257/900, 66, 350, 257/344, 347, 408

(56) References Cited

U.S. PATENT DOCUMENTS

| | | | |
|---|---|---|---|
| 3,943,551 A | * 3/1976 | Skorup ........................ 257/369 |
| 4,855,247 A | * 8/1989 | Ma et al. ..................... 257/900 |
| 5,200,352 A | 4/1993 | Pfiester ........................ 257/900 |
| 5,308,998 A | 5/1994 | Yamazaki et al. | |
| 5,324,924 A | 6/1994 | Liao ............................. 257/900 |
| 5,324,974 A | 6/1994 | Liao ............................. 257/900 |
| 5,341,012 A | 8/1994 | Misawa et al. | |
| 5,430,320 A | 7/1995 | Lee .............................. 257/900 |
| 5,444,282 A | 8/1995 | Yamaguchi et al. ......... 257/900 |
| 5,541,434 A | * 7/1996 | Nicholls et al. ............. 257/900 |
| 5,640,041 A | 6/1997 | Lur et al. ..................... 257/900 |
| 5,650,338 A | 7/1997 | Yamazaki et al. | |
| 5,698,883 A | * 12/1997 | Mizuno ....................... 257/900 |
| 5,767,930 A | 6/1998 | Kobayashi et al. | |
| 5,808,347 A | * 9/1998 | Kurimoto et al. ........... 257/900 |
| 5,898,203 A | * 4/1999 | Yoshitomi et al. .......... 257/900 |
| 5,913,112 A | 6/1999 | Yamazaki et al. | |
| 5,914,498 A | * 6/1999 | Suzawa et al. ............... 257/66 |
| 5,962,870 A | 10/1999 | Yamazaki et al. | |
| 5,962,897 A | * 10/1999 | Takemura et al. ........... 257/900 |

FOREIGN PATENT DOCUMENTS

| | | | | |
|---|---|---|---|---|
| JP | 2028939 | * | 1/1990 | .................. 257/900 |
| JP | 05-114724 | | 5/1993 | |
| JP | 07-321338 | | 12/1995 | |

* cited by examiner

*Primary Examiner*—Mark V. Prenty
(74) *Attorney, Agent, or Firm*—Eric J. Robinson; Robinson Intellectual Property Law Office, P.C.

(57) ABSTRACT

A semiconductor integrated circuit comprising thin-film transistors in each of which the second wiring is prevented from breaking at steps. A silicon nitride film is formed on gate electrodes and on gate wiring extending from the gate electrodes. Substantially triangular regions are formed out of an insulator over side surfaces of the gate electrodes and of the gate wiring. The presence of these substantially triangular side walls make milder the steps at which the second wiring goes over the gate wiring. This suppresses breakage of the second wiring.

32 Claims, 9 Drawing Sheets

SEMICONDUCTOR INTEGRATED CIRCUIT AND METHOD OF FABRICATING SAME

This application is a Divisional application of Ser. No. 08/450,953, filed May 23, 1995 and now U.S. Pat. No. 5,914,498.

BACKGROUND OF THE INVENTION

1. Field of the Invention

The present invention relates to an integrated circuit comprising an insulating substrate on which insulated-gate semiconductor devices (TFTs) in the form of thin films are formed and also to a method of fabricating the integrated circuit. The insulated substrate referred to herein means a whole object having a dielectric surface and embraces semiconductors, metals, and other materials on which an insulator layer is formed, unless stated otherwise. Semiconductor integrated circuits according to the invention can be used in various circuits and devices, such as active matrix circuits of liquid crystal displays, their peripheral driver circuits, driver circuits for driving image sensors or the like, SOI integrated circuits, and conventional semiconductor integrated circuits (e.g., microprocessors, microcontrollers, microcomputers, and semiconductor memories, and so forth).

2. Description of the Related Art

Where an active matrix liquid crystal display, an image sensor circuit, or other circuit is formed on a glass substrate, use of integrated thin-film transistors (TFTs) has enjoyed wide acceptance. In this case, it is customary to first form a first wiring including a gate electrode. Then, an interlayer insulator layer is formed. Subsequently, a second wiring is formed. If necessary, a third and even a fourth wirings may be formed.

A serious problem with such a TFT integrated circuit is that the second wiring breaks at the intersections of this second wiring and a gate wiring which is an extension of a gate electrode. This is caused by the fact that it is difficult to form an interlayer insulator layer over a gate electrode and wiring with a good step coverage and to flatten the insulator layer.

FIG. 4 illustrates wiring breakage often occurring in the prior art TFT integrated circuit. A TFT region 401 and a gate wiring 402 are formed over a substrate. An interlayer insulator 403 is formed on these region and wiring. If the edges of the gate wiring 402 are sharp, the interlayer insulator 403 cannot fully cover the gate wiring. Under this condition, if the second wiring, 404 and 405, is formed, it is likely that the second layer breaks, as shown, at portions 406.

In order to prevent such wiring breakage, it is necessary to increase the thickness of the second wiring. For example, it has been desired to increase the thickness of the gate wiring about twofold. However, this means that the unevenness on the integrated circuit is increased further. If a further wiring is required to be deposited, breakage due to the thickness of the second wiring must be taken into consideration. Where an integrated circuit whose unevenness should be suppressed as in a liquid crystal display, it is substantially impossible to address the problem by increasing the thickness of the second wiring.

In an integrated circuit, if a wiring breakage occurs even at one edge of a step, then the whole circuit is made useless. Therefore, it is important to reduce wiring breakages at steps.

SUMMARY OF THE INVENTION

It is an object of the present invention to provide a method of fabricating a semiconductor integrated circuit with minimum wiring breakages at steps and thus with improved production yield.

It is another object of the invention to provide a semiconductor integrated circuit in which wiring breakages at steps are reduced to a minimum.

In the present invention, after forming gate electrodes and gate wiring, a silicon nitride film is formed at least on their top surfaces, preferably even on their side surfaces, by plasma CVD or sputtering. Then, a substantially triangular regions (side walls) is formed out of the insulator on the side surfaces of the gate electrodes and of the gate wiring by anisotropic etching. Subsequently, an interlayer insulator is deposited, followed by formation of a second wiring. Silicon nitride exhibits a small etch rate under conditions in which silicon oxide forming the side walls is etched by dry etching. Therefore, the silicon nitride can be used as an etching stopper.

In a first method embodying the present invention, a semiconductor layer in the form of islands is first formed. A coating becoming a gate-insulating film is formed on the semiconductor layer. Then, gate electrodes and gate wiring are formed. Thereafter, silicon nitride is deposited as a film to a thickness of 100 to 2000 Å, preferably 200 to 1000 Å, by plasma-assisted CVD. Other CVD processes or sputtering techniques can also be employed. Thus, the first step of the inventive method is completed.

Then, a coating of an insulator is formed on the silicon nitride. In this stage of formation of the coating, the coverage is important. Preferably, the thickness of the coating is one-third to 2 times the height of the gate electrodes and the gate wiring. For this purpose, plasma-assisted CVD, LPCVD, atmospheric pressure CVD, and other CVD processes are preferably used. The insulator layer formed in this way is preferentially etched in a direction substantially vertical to the substrate by anisotropic etching. The etching terminates at the surface of the silicon nitride. The underlying gate electrodes and gate wiring are prevented from being etched.

As a result, substantially triangular regions of an insulator, or side walls, are left on the side surfaces of the gate electrodes and gate wiring, because the coating of the insulator is intrinsically thick on steps such as on the side surfaces of the gate electrodes and gate wiring. Thus, the second step of the inventive method is completed.

Then, an interlayer insulator is deposited. Contact holes are formed in one or both of source and drain regions of each TFT. The second wiring is formed, thus completing the third step of the inventive method.

Immediately after the side walls are formed in the second step, the film of silicon nitride can be etched by dry etching. Preferably, this etching step is performed while monitoring it with an endpoint monitor or other instrument. The etching of the film of silicon nitride can be controlled well with the monitor. The thickness of the etched silicon nitride film is 100 to 2000 Å. Therefore, even if overetching occurs, the depth is much smaller than the thickness of the gate electrodes and gate-insulating film. Hence, the gate electrodes and gate-insulating film are little affected thereby.

This method is effective where the gate-insulating film and the interlayer insulator are made from the same material different from silicon nitride. That is, if the interlayer insulator layer is formed after etching the silicon nitride film, the etching can be completed in one operation when the contact holes are formed.

Dopants are implanted to form the source and drain regions of each TFT. This implantation step can be varied variously. For example, where only N-channel TFTs are formed on a substrate, an N-type impurity may be introduced into the semiconductor layer at a relatively high concentration by self-alignment techniques, using the gate electrodes as a mask. This step is carried out between the first and second steps described above.

Similarly, where N-channel TFTs are formed, if they have the lightly doped drain (LDD) structure, an impurity is introduced into the semiconductor layer at a relatively low concentration. This step is effected between the first and second steps described above. Then, an N-type impurity is introduced into the semiconductor layer at a higher concentration by self-alignment techniques, using the gate electrodes and the side walls as a mask. This step is performed between the second and third steps described above. In this case, the width of the lightly doped drains is approximate to the width of the side walls.

Where only P-channel TFTs are formed on a substrate, similar steps may be carried out.

Where offset TFTs are fabricated, an impurity is introduced into the semiconductor layer at a high concentration, using the gate electrodes and side walls as a mask, by self-alignment techniques. This step is carried out between the second and third steps described above. In this case, the width of the offset structure is approximate to the width of the side walls. In the TFT of this construction, the width of the substantially intrinsic region becoming a channel formation region is approximately equal to the sum of the width of the gate electrode and the widths of both side walls.

A complementary MOS (CMOS) circuit having N-channel TFTs and P-channel TFTs can be fabricated similarly on a substrate. Where N-channel TFTs and P-channel TFTs are composed of ordinary TFTs, or where both kinds of TFTs are composed of LDD TFTs, an N-type impurity and a P-type impurity are implanted similarly to the above-described method in which only one kind of TFTs, or N-channel or P-channel TFTs, is formed on a substrate.

For example, where N-channel TFTs which are required to take countermeasures against hot carriers are made of the LDD type and P-channel TFTs which are not required to take such countermeasures are both made of ordinary TFTs, the impurity implantation step is a slightly special step. In this case, an N-type impurity is introduced into the semiconductor layer at a relatively low concentration. This step is carried out between the first and second steps described above. This is referred to as the first impurity introduction. At this time, the N-type impurity may be added even into the semiconductor layer of the P-channel TFTs.

Then, masking the semiconductor layer of the N-channel TFTs, a P-type impurity is introduced only into the semiconductor layer of the P-channel TFTs at a higher concentration. This is referred to as the second impurity introduction. Even if the N-type impurity exists in the P-channel TFTs as a result of the previous introduction of the N-type impurity, the P-type impurity is introduced at a higher concentration as a result of the second impurity introduction. As a result, the semi-conductor is rendered P-type. Of course, the concentration of the second impurity is greater than that of the first impurity. Preferably, the concentration of the second impurity is one to three orders of magnitude greater than that of the first impurity.

Finally, in order to form source/drain regions of the N-channel TFTs, an N-type impurity is introduced at a relatively high concentration. This step is carried out between the second and third steps described above. This is referred to as the third impurity introduction. In this case, in order to prevent the N-type impurity from being introduced into the P-channel TFTs, they may or may not be masked. In the latter case, it is necessary that the concentration of the introduced N-type impurity be lower than that of the P-type impurity introduced by the second impurity introduction. Preferably, the concentration of the introduced N-type impurity is one-tenth to two-thirds of the concentration of the P-type impurity introduced by the second impurity introduction. As a result, the N-type impurity is introduced even into the P-channel TFTs but at a lower concentration than the P-type impurity previously introduced. Therefore, the P-channel TFTs are maintained as P-type.

In the present invention, the presence of the side walls improves the step coverage at portions at which the gate wiring extends over the interlayer insulator layer, thus reducing breakages of the second wiring. Furthermore, the lightly doped structure or the offset structure can be obtained by making use of the side walls described above.

In the present invention, the existence of the silicon nitride film is of importance. In the above-described second step, anisotropic etching is done to form the side walls. However, on a dielectric surface, it is difficult to control plasma. The substrate is inevitably etched non-uniformly.

The etching depth is one-third to 2 times as large as the height of the gate electrodes and gate wiring. Therefore, the nonuniform etching produces great effects. If no silicon nitride film is formed on the top surfaces of the gate electrodes, the gate electrodes and gate wiring will be etched severely at some locations within the same substrate during the etching of the side walls.

If any silicon nitride film exists during the etching of the side walls, the etching stops at this location, thus protecting the gate electrodes and gate wiring. If the silicon nitride film is removed later by dry etching, the etching depth is much smaller than the etching depth in the side walls. Consequently, even if the gate electrodes and gate wiring are overetched, no great effects are produced.

Other objects and features of the invention will appear in the course of the description thereof, which follows.

DESCRIPTION OF THE PREFERRED EMBODIMENTS

EXAMPLE 1

Figure 1A:
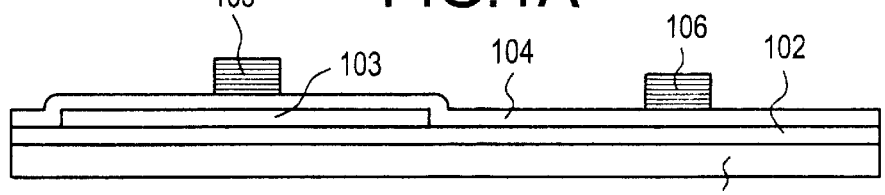
FIGS. 1(A)–1(F) are cross sectional views for showing the manufacturing method in accordance with Example 1 of the present invention.

The present example is illustrated in FIGS. 1(A)–1(F). First, silicon oxide was deposited as a buffer layer 102 on a substrate 101 made of Corning 7059glass. The substrate 101 measured 300 mm×400 mm or 100 mm×100 mm. The thickness of the buffer layer 102 was 1000 to 5000 Å, e.g., 2000 Å. The oxide film was formed in an oxygen ambient by sputtering or by plasma-assisted CVD, using TEOS as a raw material. The silicon oxide film formed in this way could be annealed at 400 to 650° C.

Then, an amorphous silicon film was deposited to a thickness of 300 to 5000 Å, preferably 400 to 1000 Å, e.g., 500 Å, by plasma-assisted CVD or LPCVD. The laminate was allowed to stand in a reducing ambient of 550 to 600° C. for 8 to 24 hours, thus crystallizing the amorphous film. At this time, a trace amount of a metal element for promoting crystallization such as nickel could be added. This step could also use laser irradiation. The silicon film crystallized in this way was etched to form island regions 103. Then, silicon oxide was deposited as a gate-insulating film 104 on the laminate to a thickness of 700 to 1500 Å, e.g., 1200 Å, by plasma-assisted CVD.

Thereafter, an aluminum film having a thickness of 1000 Å to 3 μm, e.g., 5000 Å, was formed by sputtering and etched to form a gate electrode 105 and a gate wiring 106. If an appropriate amount of silicon, copper, scandium, or other material were contained in the aluminum film, generation of hillocks could be suppressed when a silicon nitride film was formed subsequently. For example, where scandium was contained, its concentration was 0.1 to 0.3% by weight (FIG. 1(A)).

Subsequently, a silicon nitride film 107 was formed to a thickness of 100 to 2000 Å, preferably 200 to 1000 Å, e.g., 500 Å, by plasma-assisted CVD using a mixture gas of $NH_3$, $SiH_4$, and $H_2$. Other CVD processes or sputtering methods may also be used but it is desired that the gate electrode be covered with good step coverage.

Figure 1B:
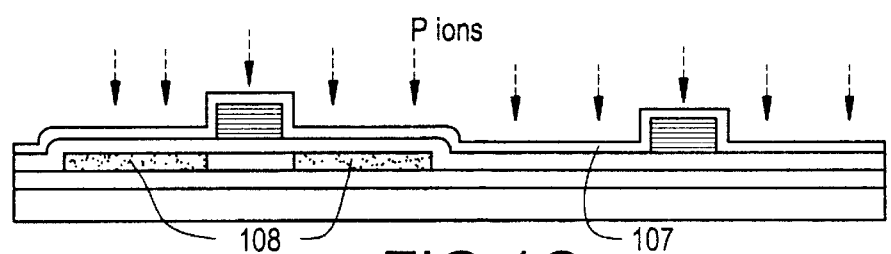
Figure 1C:
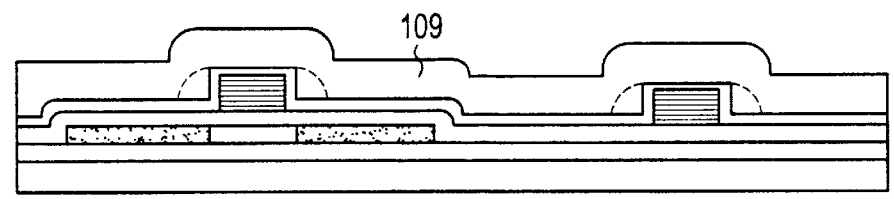
Figure 1D:
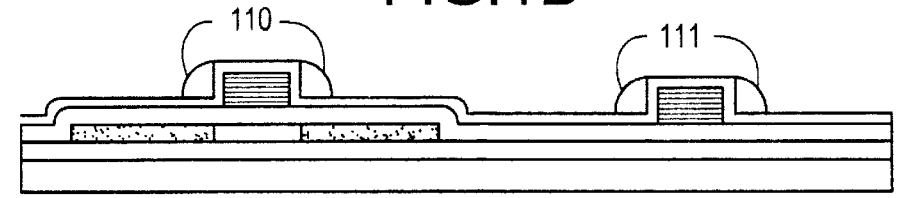
Figure 1E:
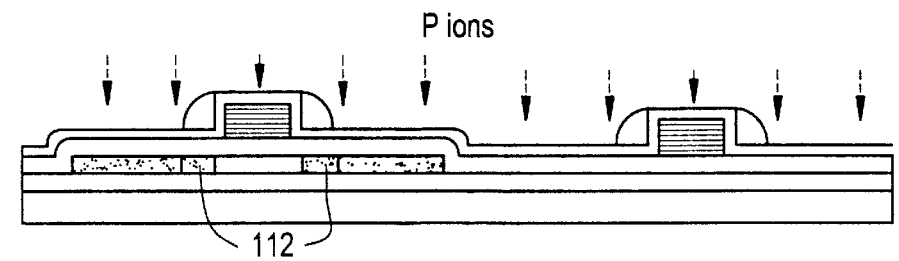
Figure 1F:
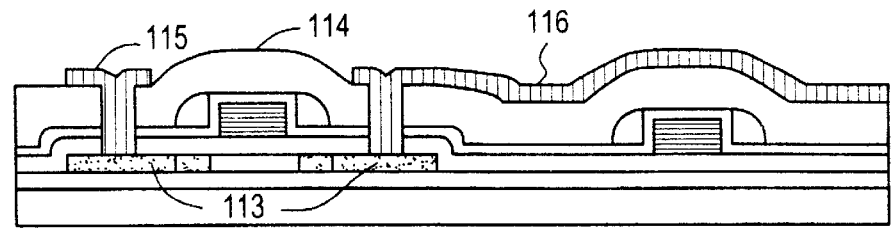

Thereafter, using the gate electrode as a mask, an impurity (in this example, phosphorus) was implanted into the silicon film 103 in the form of islands by self-aligned ion doping techniques. In this way, lightly doped regions 108 were formed, as shown in FIG. 1(B). The dose was $1 \times 10^{13}$ to $5 \times 10^{14}$ atoms/cm$^2$. The accelerating voltage was 10 to 90 kV. For example, the dose was $5 \times 10^{13}$ atoms/cm$^2$. The accelerating voltage was 80 kV (FIG. 1(B)).

A silicon oxide was deposited as a film 109 by plasma-assisted CVD, using TEOS and oxygen as raw materials or using monosilane and nitrous oxide as raw materials. The optimum value of the silicon oxide film 109 varies, depending on the height of the gate electrode and gate wiring. For example, where the height of the gate electrode and gate wiring including the silicon nitride film is about 5000 Å as in the present example, the optimum value is preferably one-third to 2 times this value, i.e., 2000 Å to 1.2 μm. In this example, the value was 6000 Å. In this film formation step, the film thickness of planar portions is required to be uniform. In addition, the step coverage must be good. As a result, the thickness of the silicon oxide film at the side surfaces of the gate electrode and gate wiring is increased by the portions indicated by the broken lines in FIG. 1(C) (FIG. 1(C)).

This silicon oxide film 109 was etched by anisotropic etching, using the well-known RIE process. This etching terminated at the surface of the silicon nitride film 107. Since the silicon nitride film was not readily etched by anisotropic etching using the RIE process, the etching did not progress into the gate-insulating film 104. By the steps described thus far, substantially triangular region of an insulator or side walls 110 and 111 were left on the side surfaces of the gate electrode and gate wiring (FIG. 1(D)).

Then, phosphorus ions were implanted again by ion doping. In this case, the dose is preferably one to three orders of magnitude higher than the dose used in the step shown in FIG. 1(B). In the present example, the dose was 40 times as high as the dose of the initially implanted phosphorus, i.e., $2 \times 10^{15}$ atoms/cm$^2$. The accelerating voltage was 80 kV. As a result, source/drain regions 113 heavily doped with phosphorus were created. Lightly doped regions 112 were left under the side walls (FIG. 1(E)).

The laminate was irradiated with KrF excimer laser light having a wavelength of 248 nm and a pulse width of 20 nsec to activate the dopant. The energy density of the laser light was 200 to 400 mJ/cm$^2$, preferably 250 to 300 mJ/cm$^2$. In the present example, the gate electrode was made of aluminum. Since the gate electrode was capped with the silicon nitride film 107, the gate electrode was not affected by the laser irradiation. Instead of the laser irradiation, rapid thermal annealing (RTA) or rapid thermal processing (RTP) can be utilized.

Finally, silicon oxide was deposited as an interlayer insulator layer 114 over the whole surface to a thickness of 5000 Å by CVD. Contact holes were created in the source/drain regions of the TFT. The second wiring, or aluminum wiring 115 and aluminum electrodes 116, was formed. The thickness of the aluminum wiring was approximate to the thickness of the gate electrode and wiring, i.e., 4000 to 6000 Å.

TFTs having N-channel LDDs were completed by the manufacturing steps described thus far. In order to activate the doped regions, hydrogen annealing may be carried out at 200 to 400° C. The presence of the side walls 111 make milder the steps over which the second wiring 116 are extended. Therefore, little breakages were observed although the thickness of the second wiring was substantially the same as the thickness of the gate electrode and wiring (FIG. 1(F)).

When the thickness of the gate electrode/wiring is x (Å) and the thickness of the second wiring is y (Å), the following relation should be satisfied in order to prevent wire disconnection.

$$y \geq x - 1000 \text{ (Å)}$$

As the thickness y is reduced, more desirable results are obtained. The inventors of the present invention have found that in the case of a circuit required to have a less uneven surface as in the active matrix circuit of a liquid crystal display, if the relations given by $$x - 1000 \text{ (Å)} \leq y \leq x + 1000 \text{ (Å)}$$

are met, then satisfactory results arise.

EXAMPLE 2

FIGS. 2(A)–2(F) illustrate the second example of the present invention. The present example pertains to a monolithic active matrix circuit having an active matrix circuit and a driver circuit for driving the active matrix circuit. Both the active matrix circuit and the driver circuit are formed on the same substrate. In the present example, P-channel TFTs are used for the switching devices of the active matrix circuit. The driver circuit is a complementary circuit consisting of N-channel and P-channel TFTs. Shown at the left sides of FIGS. 2(A)–2(F) are cross-sectional views of the N-channel TFT used in the driver circuit, illustrating the process sequence. Shown at the right sides of FIGS. 2(A)–2(F) are cross-sectional views of the P-channel TFT used in the driver circuit or in the active matrix circuit, illustrating the process sequence. P-channel TFTs are used as the switching circuits of the active matrix circuit, because the leakage current (also called as OFF current) is small.

First, an insulating oxide was deposited as a buffer layer 202 on a substrate 201 made of Corning 7059 glass, in the same way as in Example 1. A semiconductor region in the form of islands was formed on the buffer layer 202. A silicon oxide film 203 acting as a gate oxide film was formed. Gate electrodes 204 and 205 were formed out of an aluminum film having a thickness of 5000 Å. Then, in the same way as in Example 1, a silicon oxide film 206 having a thickness of 100 to 2000 Å, e.g., 1000 Å, was formed. Using the gate electrode as a mask, phosphorus ions were implanted by ion doping. As a result, lightly doped N-type regions 207 and 208 were formed. The dose was $1\times10^{13}$ atoms/cm$^2$.

The laminate was irradiated with KrF excimer laser light having a wavelength of 248 nm and a pulse width of 20 nsec to activate the implanted dopant. The energy density of the laser light was 200 to 400 mJ/cm$^2$, preferably 250 to 300 mJ/cm$^2$ (FIG. 2(A)).

Then, the N-channel TFT regions were masked with photoresist 209. Under this condition, boron ions were implanted at a high dose of $5\times10^{15}$ atoms/cm$^2$ by ion doping. The accelerating voltage was 65 kV. As a result, the region 208 which was lightly doped N-type by the previous implant of phosphorus was changed into a strong P-type. Thus, a P-type doped region 210 was formed. The laminate was then irradiated with laser light to activate the dopant (FIG. 2(B)).

Figure 2A:
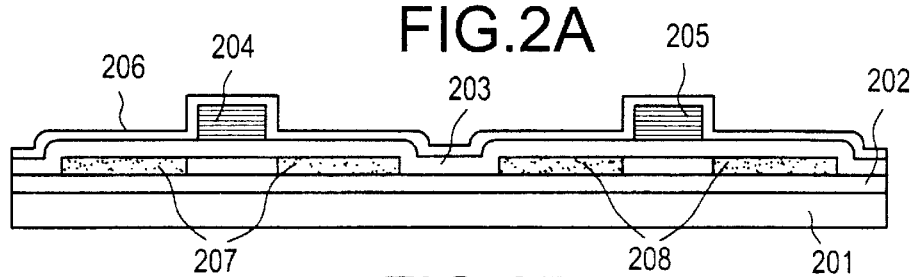
FIGS. 2(A)–2(F) are cross sectional views for showing the manufacturing method in accordance with Example 2 of the present invention.
Figure 2B:
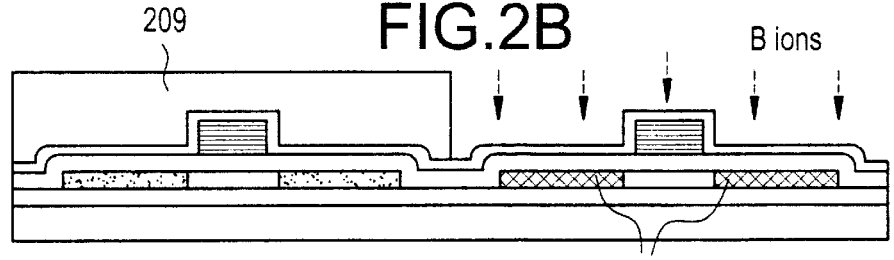
Figure 2C:
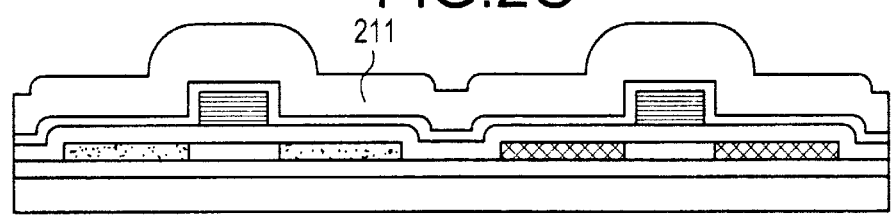

After removing the mask 209 of the photoresist, a silicon oxide film 211 having a thickness of 4000 to 8000 Å was formed by plasma-assisted CVD (FIG. 2(C)).

Figure 2D:
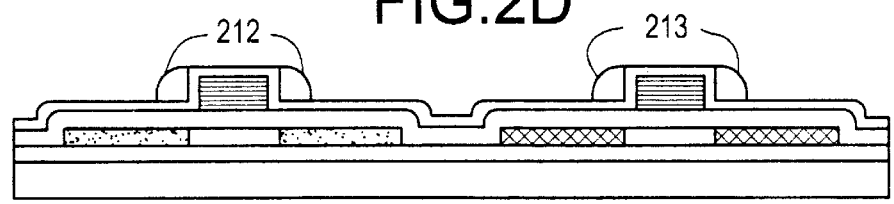
Figure 2E:
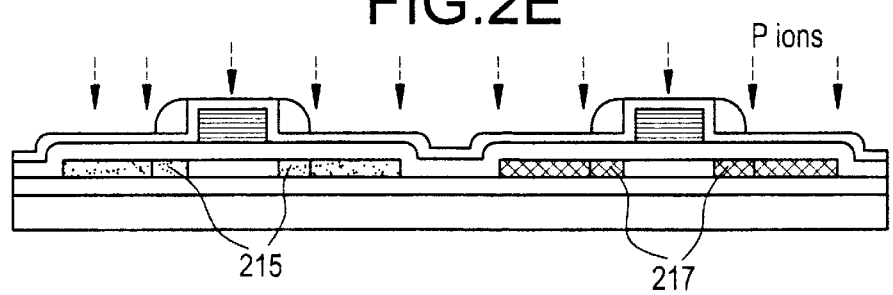

Side walls 212 and 213 of silicon oxide were formed on the side surfaces of the gate electrode by anisotropic etching, in the same way as in Example 1 (FIG. 2(D)).

Then, phosphorus ions were implanted by ion doping. In this case, the dose was 1 to 3 orders of magnitude greater than the dose used in the step illustrated in FIG. 2(A). Preferably, the dose is one-tenth to two-thirds of the dose used in the step illustrated in FIG. 2(B). In the present example, the dose was 200 times as high as the dose of the phosphorus ions first implanted, i.e., $2\times10^{15}$ atoms/cm$^2$. This is 40% of the dose of the boron used in the step illustrated in FIG. 2(B). The accelerating voltage was 80 kV. As a result, source/drain regions 214 heavily doped with phosphorus were formed. Lightly doped drain (LDD) regions 215 were formed under the side walls.

The laminate was irradiated with KrF excimer laser light having a wavelength of 248 nm and a pulse width of 20 sec to activate the implanted dopant. The energy density of the laser light was 200 to 400 mJ/cm$^2$, preferably 250 to 300 mJ/cm$^2$.

The P-channel TFT (the right side in the figure) was doped with phosphorus and maintained in P-type, because the concentration of the previously doped boron was 2.5 times as high as the concentration of the phosphorus. Apparently, the P-type region of the P-channel TFT had two kinds of regions, i.e., regions 217 under the side walls and outer regions 216 on the opposite side of the channel formation regions. However, these two kinds of regions made no great difference in electrical characteristics (FIG. 2(E)).

Figure 2F:
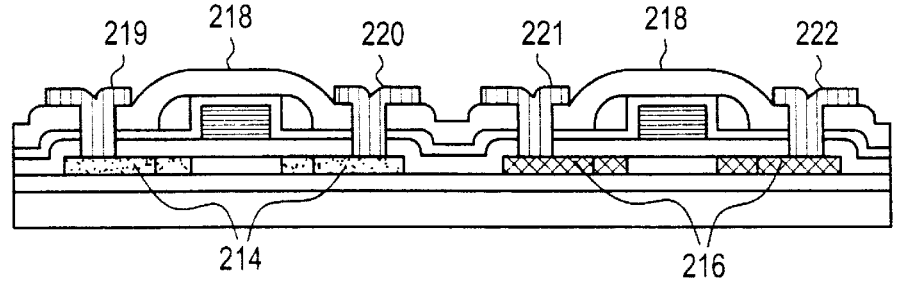
Figure 3A:
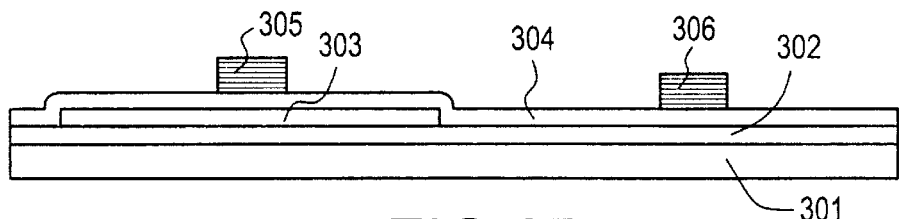
FIGS. 3(A)–3(E) are cross sectional views for showing the manufacturing method in accordance with Example 3 of the present invention.
Figure 3B:
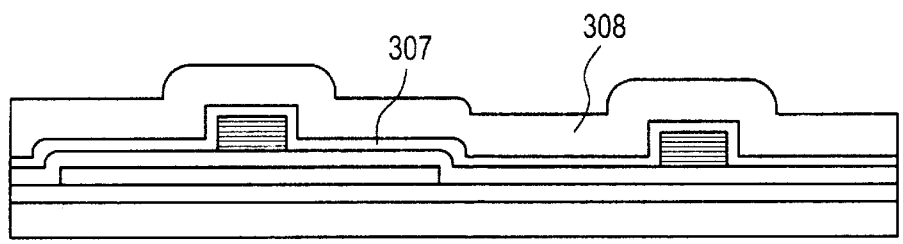
Figure 3C:
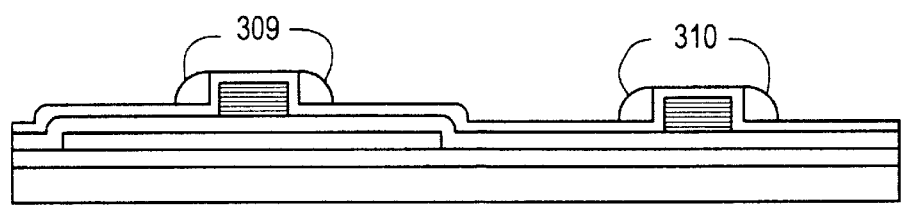
Figure 3D:
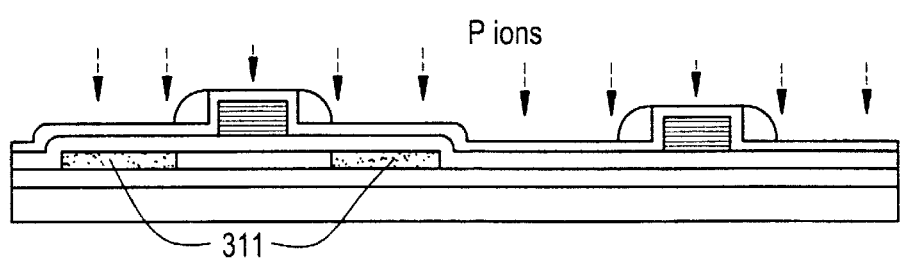
Figure 3E:
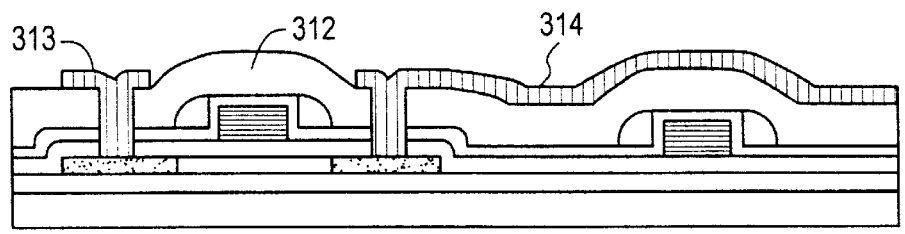
Figure 4:
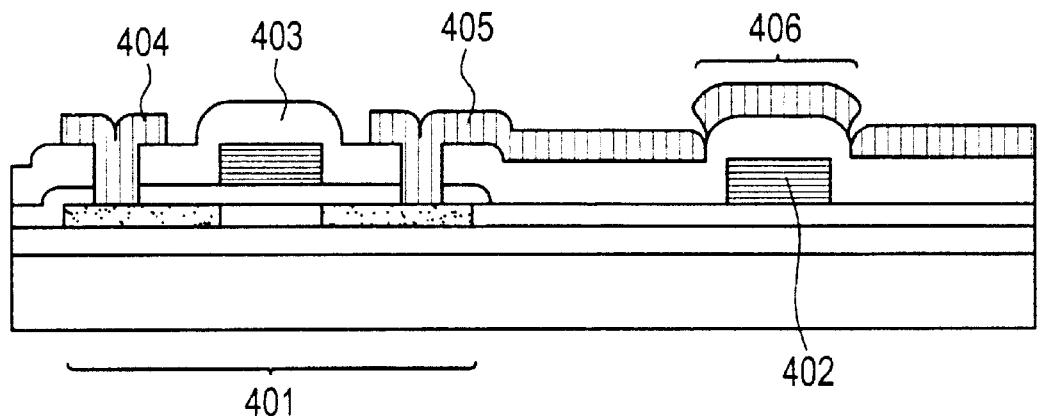
FIG. 4 is a cross section of a TFT circuit, illustrating the prior art fabrication method.

Finally, as shown in FIG. 2(F), silicon oxide was deposited as an interlayer insulator layer 218 to a thickness of 3000 Å over the whole surface, as shown in FIG. 2(F). Contact holes were created in the source/drain regions of the TFT. Aluminum wiring/electrodes 219, 220, 221, 222 were created. A semiconductor integrated circuit in which the N-channel TFT was of the lightly doped drain (LDD) structure was completed.

The interlayer insulator layer was not very thick at the portion at which the second wiring went over the gate wiring. However, almost no wiring breakages were observed in the same way as in Example 1.

In the present example, the N-channel TFT assumed the LDD structure to prevent hot carriers from deteriorating the performance of the device. However, the LDD region was a parasitic resistor inserted in series with the source/drain regions and so the operating speed dropped. Accordingly, in the case of the P-channel TFT which has a small mobility and is less susceptible to deterioration due to hot carriers, it is desired that no LDD exist as in the present example.

In the present example, the dopant was activated by laser irradiation whenever a doping step was carried out. Alternatively, all activation steps may be simultaneously performed immediately before all the doping steps were ended and the interlayer insulator layer was formed.

EXAMPLE 3

The present example is illustrated in FIGS. 3(A)–3(E). The present example is an example of fabrication of a TFT, using formation of offset regions employing side walls.

First, silicon oxide was formed as a buffer layer 302 on a substrate 301 to a thickness of 1000 to 5000 Å, e.g., 2000 Å, in the same way as in Example 1. The silicon oxide film could be annealed at 400 to 650° C. A region 303 in the form of islands was formed by the method described in Example 1. A silicon oxide film 304 having a thickness of 700 to 1500 Å, e.g., 1200 Å, was formed by plasma-assisted CVD.

Then, a phosphorus-doped polycrystalline silicon film having a thickness of 1000 Å to 3 μm, e.g., 5000 Å, was formed by LPCVD. This was etched to form a gate electrode 305 and a gate wiring 306 (FIG. 3(A)).

Thereafter, a silicon nitride film 307 was formed to a thickness of 100 to 2000 Å, preferably 200 to 1000 Å, within a mixture gas of phosphine ($NH_3$), monosilane ($SiH_4$), and hydrogen ($H_2$) by plasma-assisted CVD. This silicon nitride film may also be formed by sputtering or other method.

A silicon oxide film 308 was deposited by plasma-assisted CVD, using TEOS and oxygen as gaseous raw materials or using monosilane and nitrous oxide as gaseous raw materials. The optimum thickness of the silicon oxide film 110 varies, depending on the height of the gate electrode and gate wiring. For example, where the thickness of the gate electrode and gate wiring including the thickness of the silicon nitride film is about 6000 Å as in the present example, the optimum thickness of the layer 308 is preferably one-third to 2 times this value, i.e., 2000 Å to 1.2 μm. In this example, the thickness was 6000 Å. In this film formation step, the film thickness of planar portions is required to be uniform. In addition, the step coverage must be good (FIG. 3(B)).

This silicon oxide film 308 was etched by anisotropic etching, using the well-known RIE process. This etching terminated at the surface of the silicon nitride film 307. Since the silicon nitride film was not readily etched by anisotropic etching using the RIE process, the etching, did not progress into the gate-insulating film 304. By the manufacturing steps described thus far, side walls 309 and 310, were left on the side surfaces of the gate electrode and gate wiring (FIG. 3(C)).

Then, phosphorus ions were introduced by ion doping techniques.

The dose was $1 \times 10^{14}$ to $5 \times 10^{17}$ atoms/cm$^2$. The accelerating voltage was 10 to 90 kV. For example, the dose was $2 \times 10^{15}$ atoms/cm$^2$. The accelerating voltage was 80 kV. As a result, source/drain regions 311 doped with phosphorus were formed. Phosphorus was not introduced into regions located under the side walls. In this way, offset regions were created (FIG. 3(D)).

The laminate was irradiated with KrF excimer laser light having a wavelength of 248 nm and a pulse width of 20 nsec to activate the introduced dopant. The energy density of the laser light was 200 to 400 mJ/cm$^2$, preferably 250 to 300 mJ/cm$^2$. Instead of the laser irradiation, thermal annealing may be effected.

Finally, a silicon oxide film was deposited as an interlayer insulator layer 312 to a thickness of 5000 Å over the whole surface by CVD. Contact holes were created in the source/drain regions of the TFT. The second aluminum layer forming aluminum wiring 313 and 314 was formed. The thickness of the aluminum wiring was approximate to that of the gate electrode/wiring, i.e., 4000 to 6000Å.

A TFT having an N-channel offset region was completed by the manufacturing steps described thus far. In order to activate the doped regions, the laminate may be subsequently subjected to hydrogen annealing conducted at 200 to 400° C. The presence of the side wall 310 makes milder the step at which the second wiring 314 goes over the gate wiring 306. Therefore, almost no wiring breakages were observed irrespective of the fact that the thickness of the wiring of the second layer is approximate to-that of the gate electrode/wiring (FIG. 3(D)).

EXAMPLE 4

The present example is illustrated in FIGS. 5(A)–5(F). In the present example, a TFT having an N-channel offset region and a TFT having an N-channel LDD region are formed on the same substrate.

First, in the same way as in Example 1, an oxide film 502 acting as a buffer layer, a silicon semiconductor region in the form of islands, and a silicon oxide film 503 serving as a gate oxide film were formed on a substrate 501. Gate electrodes 504 and 505 were formed out of an aluminum film having a thickness of 5000 Å. Then, a silicon nitride film 506 was formed to a thickness of 100 to 2000 Å, e.g., 1000 Å, in the same way as in Example 1 (FIG. 5(A)).

Thereafter, the offset TFT regions were masked with photoresist 507. Under this condition, phosphorus ions were implanted into the TFT having the LDD region by ion doping, using the gate electrode as a mask. Thus, lightly doped N-type regions 508 were created. The dose was $1 \times 10^{13}$ atoms/cm$^2$, for example.

The laminate was irradiated with KrF excimer laser light having a wavelength of 248 nm and a pulse width of 20 nsec to activate the introduced dopant. The energy density of the laser light was 200 to 400 mJ/cm$^2$, preferably 250 to 300 mJ/cm$^2$ (FIG. 5(B)).

Figure 5A:
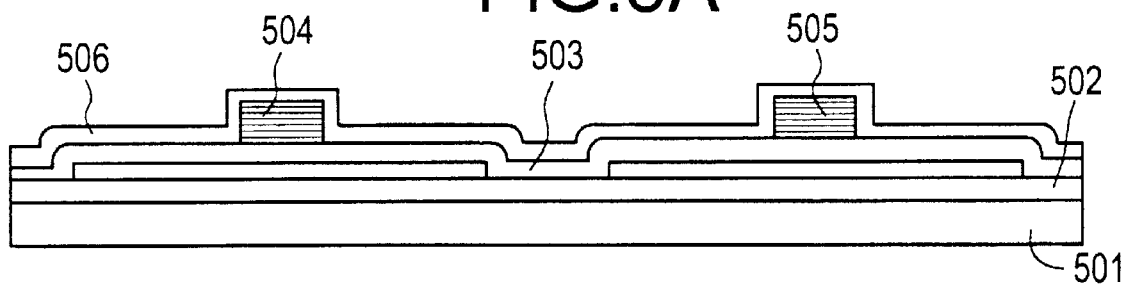
FIGS. 5(A)–5(F) are cross sectional views for showing the manufacturing method in accordance with Example 4 of the present invention.
Figure 5B:
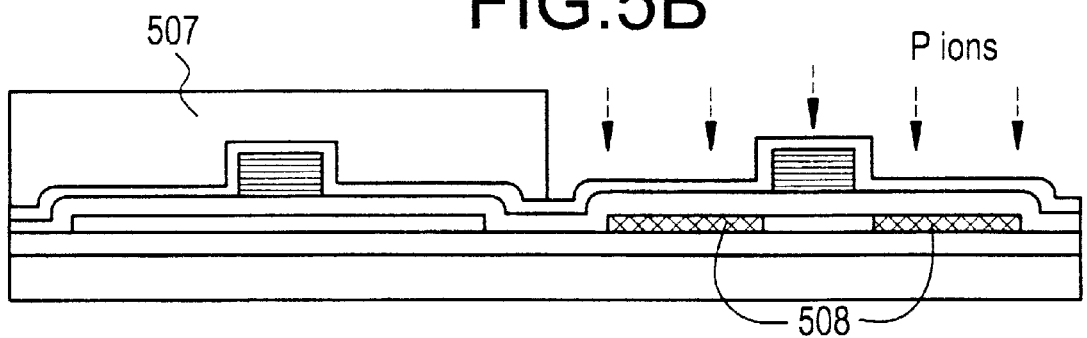
Figure 5C:
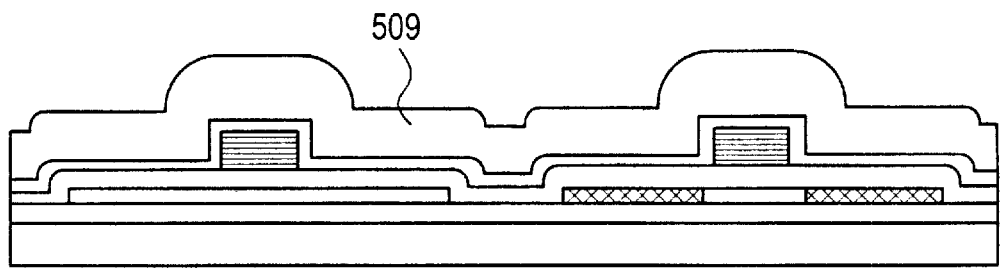
Figure 5D:
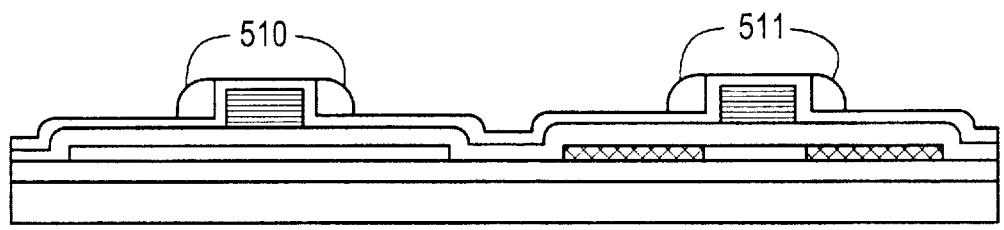
Figure 5E:
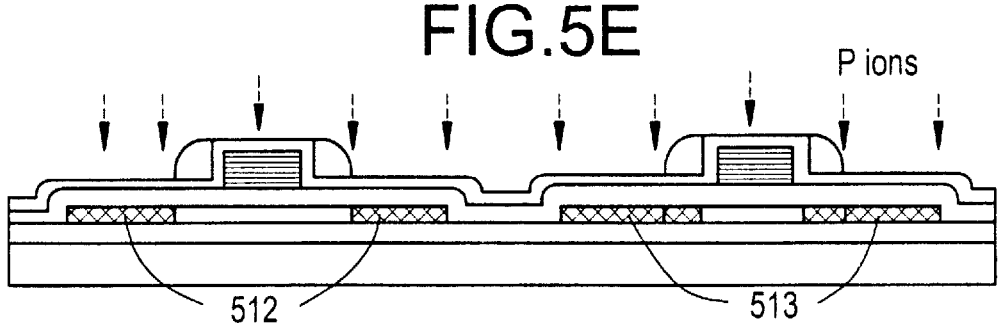

After removing the mask 507 of the photoresist, a silicon oxide film 509 having a thickness of 4000 to 8000 Å, e.g., 6000 Å, was formed by plasma-assisted CVD (FIG. 5(C)).

In the same way as in Example 1, the silicon oxide film 509 was etched by anisotropic etching, in the same way as in Example 1. Side walls 510 and 511 of silicon oxide were formed on the side surfaces of the gate electrode (FIG. 5(D)).

Then, phosphorus ions were implanted again by ion doping. In this case, the dose is preferably one to three orders of magnitude higher than the dose used in the step shown in FIG. 5(B). In the present example, the dose was 200 times as high as the dose of the initially implanted phosphorus, i.e., $2 \times 10^{15}$ atoms/cm$^2$. The accelerating voltage was 80 kV. As a result, source/drain regions 512 and 513 heavily doped with phosphorus were created. In the step illustrated in FIG. 5(B), an offset region was left under the side wall of the masked TFT. A lightly doped region 514 was left under the side wall of the TFT lightly doped with phosphorus.

Then, the laminate was irradiated with KrF excimer laser light having a wavelength of 248 nm and a pulse width of 20 nsec to activate the introduced dopant. The energy density of the laser light was 200 to 400 mJ/cm$^2$, preferably 250 to 300 mJ/cm$^2$ (FIG. 5(E)).

Figure 5F:
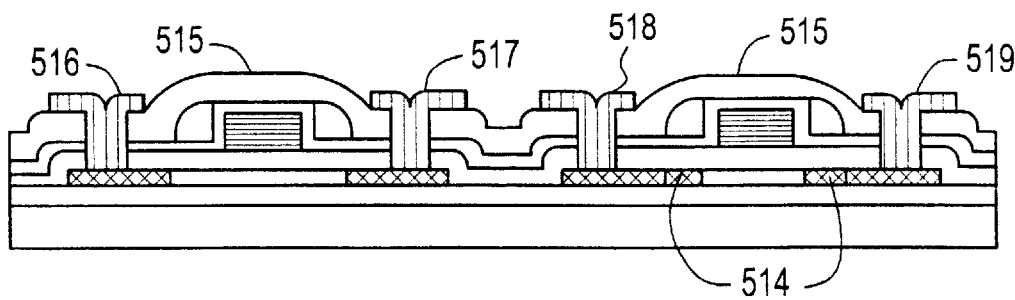

Finally, as shown in FIG. 5(F), silicon oxide was deposited as an interlayer insulator layer 515 to a thickness of 3000 Å over the whole surface. Contact holes were created in the source/drain regions of the TFT. Aluminum wiring and electrodes 516, 517, 518, and 519 were created. A semiconductor integrated circuit in which the N-channel TFT was the lightly doped drain (LDD) structure was completed.

The interlayer insulator layer was not very thick at the portion (not shown) at which the second wiring went over the gate wiring. However, almost no wiring breakages were observed in the same way as in Example 1.

In the present example, the dopant was activated by laser irradiation whenever an implantation step was carried out. Alternatively, all activation steps may be simultaneously performed immediately after all the implantation steps were ended but before the interlayer insulator layer was formed.

In the description made in connection with FIGS. 5(A)–5(F), only the N-channel TFT was described. A CMOS circuit may be constructed by forming both an N-channel TFT and a P-channel TFT on the same substrate, in the same way as in Example 2. For example, in a monolithic active matrix circuit comprising a substrate on which a peripheral circuit and an active matrix circuit are both formed, a CMOS circuit using an LDD N-channel TFT having a high operating speed and an ordinary NMOS TFT is used as the peripheral circuit. N- or P-channel offset TFTs are used as the active matrix circuit which is required to exhibit low leakage current. Especially, the P-channel offset TFT is effective in reducing the leakage current. Of course, both N- and P-channel types can be composed of LDD TFTs.

EXAMPLE 5

The present example is illustrated in FIGS. 6(A)–6(F). First, silicon oxide was formed as a buffer layer 602 on a substrate 601 to a thickness of 1000 to 5000 Å, e.g., 2000 Å, in the same way as in Example 1. Then, in the same way as in Example 1, a silicon region in the form of islands was formed to a thickness of 500 Å. Silicon oxide was deposited as a gate-insulating film 603 on the laminate to a thickness of 700 to 1500 Å, e.g., 1200 Å, by plasma-assisted CVD.

Then, a gate electrode 604 and a gate wiring 605 were formed out of an aluminum film having a thickness of 5000 Å. Furthermore, a silicon nitride film 606 was deposited to a thickness of 100 to 2000 Å, preferably 200 to 1000 Å, e.g., 500 Å, by plasma-assisted CVD.

Figure 6A:
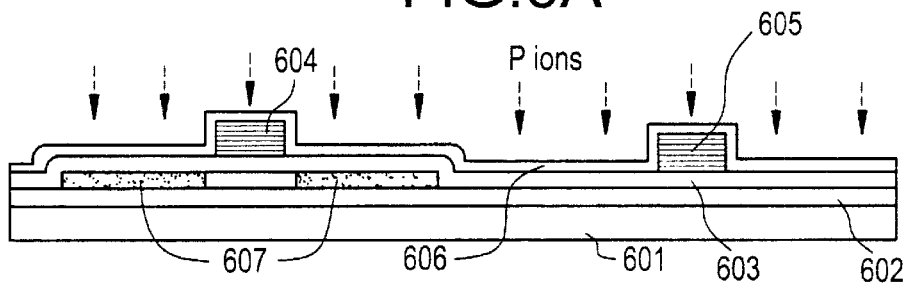
FIGS. 6(A)–6(F) are cross sectional views for showing the manufacturing method in accordance with Example 5 of the present invention.
Figure 6B:
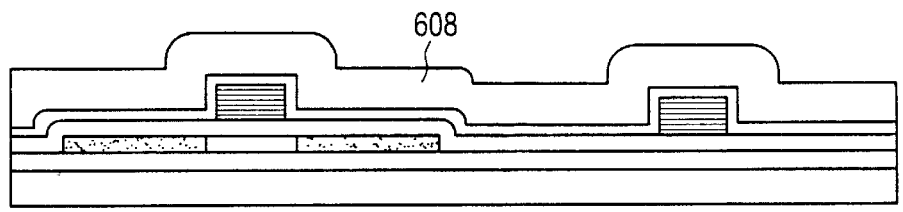

Thereafter, using the gate electrode as a mask, an impurity (in this example, phosphorus) was implanted into the silicon film in the form of islands by self-aligned implantation techniques. In this way, lightly doped regions 607 were formed, as shown in FIG. 6(A). The dose was $1\times10^{13}$ to $5\times10^{14}$ atoms/cm$^2$. The accelerating voltage was 10 to 90 kV. For example, the dose was $5\times10^{13}$ atoms/cm$^2$. The accelerating voltage was 80 kV (FIG. 6(A)).

A silicon oxide film 608 was deposited by plasma-assisted CVD. The thickness was 6000 Å. In this film formation step, the film thickness of planar portions is required to be uniform. In addition, the step coverage must be good (FIG. 6(B)).

Figure 6C:
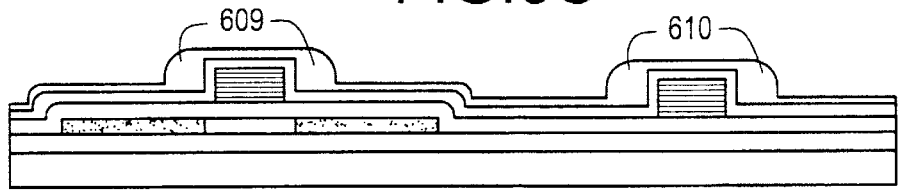
Figure 6D:
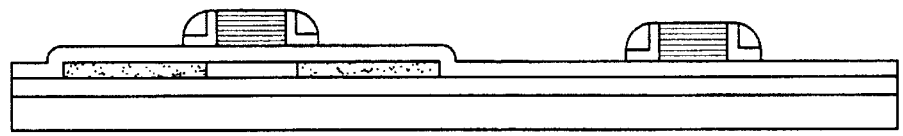
Figure 6E:
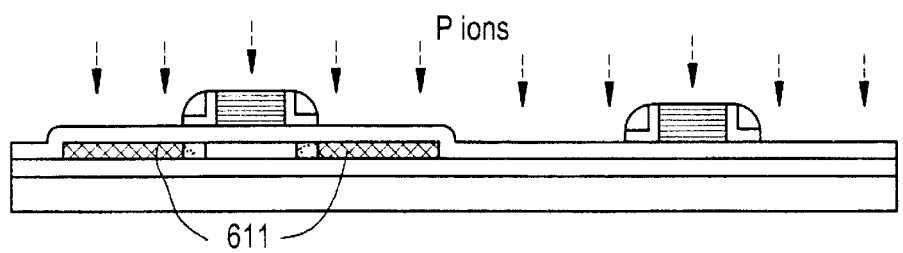
Figure 6F:
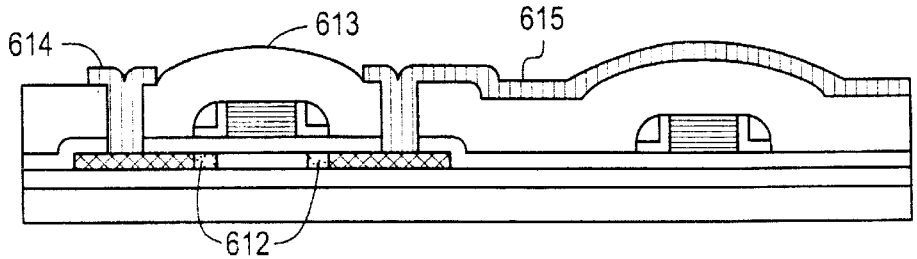

Then, an anisotropic dry etching step was conducted, using CHF$_3$ to etch the silicon oxide film 608. At this time, the etching can be performed until it goes to the silicon nitride film 606. Preferably, as shown in FIG. 6(C), the etching is stopped immediately before the etching reaches the silicon nitride film 606 so that a slight amount of the silicon oxide film 608 is left behind. Substantially triangular regions of insulator, or side walls 609 and 610, were left on the side surfaces of the gate electrode/wiring by the manufacturing steps described thus far (FIG. 6(C)).

Subsequently, a dry etching step was carried out, using CH$_4$ and O$_2$ to etch away the slight amount of silicon oxide film left on the silicon nitride film, as well as the silicon nitride film. Since this etching step can be monitored with an endpoint monitor (plasma monitor), the gate electrode and the gate-insulating film are prevented from being overetched (FIG. 6(D)).

Then, phosphorus ions were implanted again by ion doping. In this case, the dose is preferably one to three orders of magnitude higher than the dose used in the step shown in FIG. 6(A). In the present example, the dose was 40 times as high as the dose of the initially implanted phosphorus, i.e., $2\times10^{15}$ atoms/cm$^2$. The accelerating voltage was 80 kV. As a result, source/drain regions 611 heavily doped with phosphorus were created. Lightly doped regions 612 were left under the side walls.

Then, the laminate was irradiated with KrF excimer laser light having a wavelength of 248 nm and a pulse width of 20 nsec to activate the introduced dopant. The energy density of the laser light was 200 to 400 mJ/cm$^2$, preferably 250 to 300 mJ/cm$^2$ (FIG. 6(E)).

Finally, a silicon oxide film was deposited as an interlayer insulator layer 613 to a thickness of 5000 Å over the whole surface by CVD. Contact holes were created in the source/drain regions of the TFT. The second aluminum layer forming aluminum wiring 614 and 615 was formed. The thickness of the aluminum wiring was approximate to that of the gate electrode/wiring, i.e., 4000 to 6000 Å.

A TFT having an N-channel offset region was completed by the manufacturing steps described thus far. In order to activate the doped regions, the laminate may be subsequently subjected to hydrogen annealing conducted at 200 to 400° C. In the same way as in Example 1, the presence of the side wall 610 makes milder the step at which the second wiring 613 goes over the gate wiring 605. Therefore, almost no wiring breakages were observed irrespective of the fact that the thickness of the wiring of the second layer is approximate to that of the gate electrode/wiring (FIG. 6(F)).

In the present example, the silicon nitride film 606 was etched, and the gate-insulating film 603 was exposed. This enabled contact holes to be formed in one operation, i.e., wet etching process. As can be seen from FIG. 6(E), as a result of the etching of the silicon nitride film, the silicon nitride film was left only between the gate electrode 604 or 605 and each of the side walls 609 and 610 or between the gate-insulating film 603 and the side walls 609 and 610.

EXAMPLE 6

The present example is illustrated in FIGS. 7(A)–7(F). In the present example, in the same way as in Example 2, an LDD N-channel TFT and an ordinary P-channel TFT are formed on the same substrate. The left sides of FIGS. 7(A)–7(F) are cross sections of an N-channel TFT, illustrating the process sequence for fabricating the TFT. The right sides of FIGS. 7(A)–7(F) are cross sections of a P-channel TFT, illustrating the process sequence for fabricating the TFT. First, an oxide film 702 acting as a buffer layer, a silicon semiconductor layer in the form of islands, and a silicon oxide film 703 acting as a gate oxide film were formed on a substrate 701 made of Corning 7059 glass. Then, gate electrodes 704 and 705 were formed out of an aluminum film having a thickness of 5000 Å.

Then, using the gate electrode 704 as a mask, the gate oxide film in the portion of the N-channel TFT was selectively removed to expose the semiconductor layer. Subsequently, a silicon nitride film 706 having a thickness of 100 to 2000 Å, preferably 200 to 1000 Å, e.g., 400 Å, was formed by plasma-assisted CVD.

Using the gate electrode as a mask, phosphorus ions were implanted by ion doping to form lightly doped N-type regions 707. The dose was $1\times10^{13}$ atoms/cm$^2$. The accelerating voltage was 20 keV. During this doping process, the accelerating voltage was low. Therefore, phosphorus ions were not implanted into the islands 708 of the P-channel TFT coated with the gate oxide film 703 (FIG. 7(A)).

Then, the N-channel TFT regions was masked with photoresist 709. Under this condition, boron ions were implanted at a high concentration by ion doping. The dose was $5\times10^{14}$ atoms/cm$^2$. The accelerating voltage was 65 kV. As a result, P-type doped regions 710 were formed in the islands 708 (FIG. 7(B)).

In the present example, after the whole surface was lightly doped with phosphorus, the surface was selectively heavily doped with boron. The sequence in which these two -steps are carried out may be reversed.

Figure 7A:
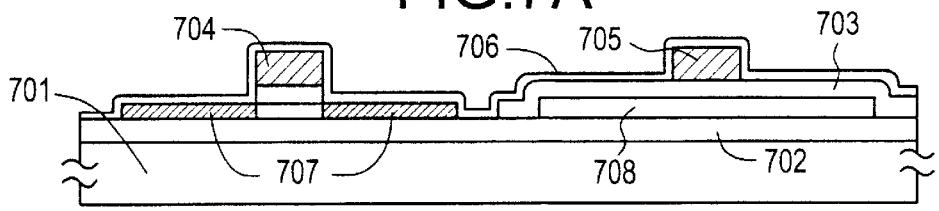
FIGS. 7(A)–7(F) are cross sectional views for showing the manufacturing method in accordance with Example 6 of the present invention.
Figure 7B:
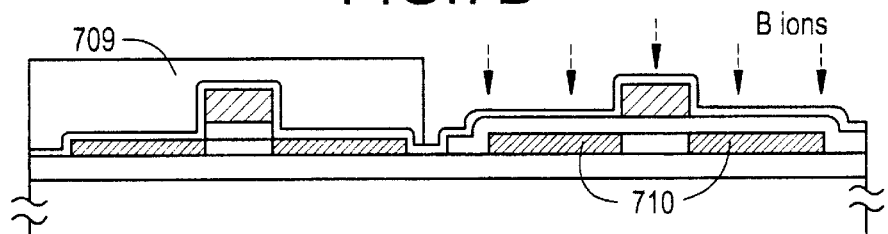
Figure 7C:
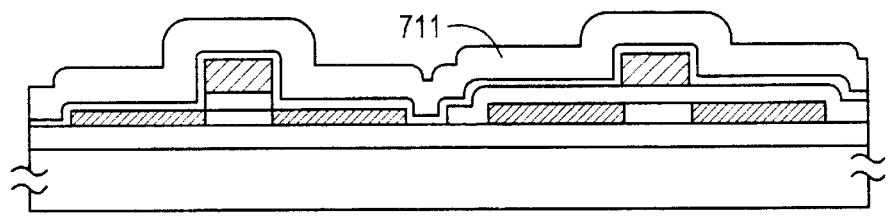

After removing the photoresist mask 709, a silicon oxide film 711 having a thickness of 4000 to 8000 Å was formed by plasma-assisted CVD (FIG. 7(C)).

Figure 7D:
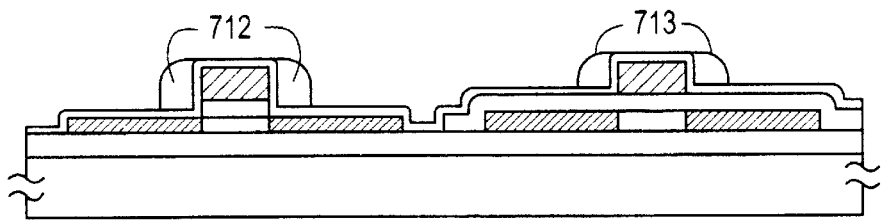
Figure 7E:
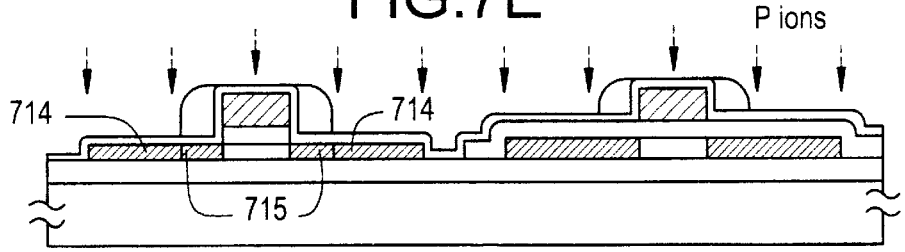

Then, side walls 712 and 713 of silicon oxide were formed on the side surfaces of the gate electrode by anisotropic etching, similarly to Example 2 (FIG. 7(D)).

Then, phosphorus ions were introduced again by ion doping. In this case, the dose is preferably one to three orders of magnitude higher than the dose used in the step shown in FIG. 7(A). In the present example, the dose was 200 times as high as the dose of the initially implanted phosphorus, i.e., $2\times10^{15}$ atoms/cm$^2$. The accelerating voltage was 20 kV. As a result, source/drain regions 714 heavily doped with phosphorus were created. Lightly doped regions 715 were left under the side walls.

On the other hand, the P-channel region was not doped with phosphorus ions because of the presence of the gate oxide film. In Example 2, the P-channel TFT was doped heavily with both phosphorus ions and boron ions and so the limitations are imposed on the their doses. In the present example, no limitations are placed on the doses. However, with respect to the accelerating voltage, it must be set low for phosphorus ions and set high for boron ions (FIG. 7(E)).

Then, the laminate was irradiated with KrF excimer laser light having a wavelength of 248 nm and a pulse width of 20 nsec to activate the introduced dopant. The energy density of the laser light was 200 to 400 mJ/cm$^2$, preferably 250 to 300 mJ/cm$^2$.

Figure 7F:
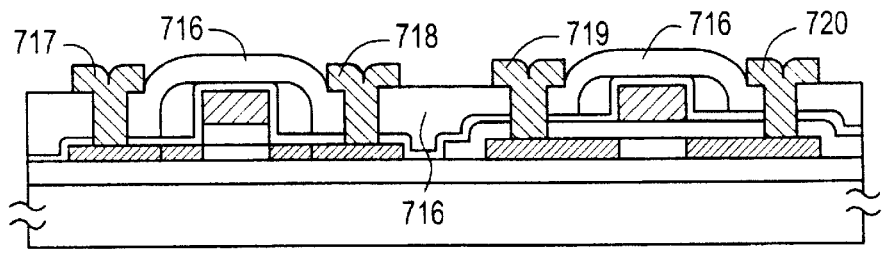

Finally, as shown in FIG. 7(F), silicon oxide was deposited as an interlayer insulator layer 716 to a thickness of 5000 Å over the whole surface by CVD. Contact holes were created in the source/drain regions of the TFTs. Aluminum electrodes and aluminum wiring 717, 718, 119, and 720 were created. A semiconductor integrated circuit consisting of the N-channel TFT made of the lightly doped drain (LDD) structure was completed by the manufacturing steps described thus far.

Compared with Example 2, the present example further needs a photolithography step and an etching step to remove the gate oxide film from the N-channel TFT portion. However, substantially no N-type impurity was implanted into the P-channel TFT and, therefore, the doses of the N-type and P-type impurities can be relatively arbitrarily changed.

The phosphorus ions were implanted into the portions close to the surface of the gate oxide film 703 of the P-channel TFT. The phosphorus ions will form phosphosilicate glass in the later laser irradiation step.

This is effective in preventing movable ions such as sodium ions from entering.

EXAMPLE 7

The present example is illustrated in FIGS. 8(A)–8(G). The present example relates to a method of fabrication of an active matrix liquid crystal display. This method is now described by referring to FIGS. 8(A)–8(G). Two TFTs located at the left sides of FIGS. 8(A)–8(G) are composed of an LDD N-channel TFT and an ordinary P-channel TFT, respectively. These TFTs are logic circuits used in a peripheral circuit or the like. The TFT shown at the right is a switching transistor used in an active matrix array. The right TFT is an offset P-channel TFT.

First, an oxide film acting as a buffer layer, a silicon semiconductor region in the form of islands, and a silicon oxide film 803 acting as a gate oxide film were formed on a substrate made of Corning 7059 glass. The silicon semiconductor region in the form of islands is composed of an island region 801 for a peripheral circuit and an island region 802 for an active matrix circuit. Gate electrodes 804 and 805 for the peripheral circuit were formed out of an aluminum film having a thickness of 5000 Å. Also, a gate electrode 806 for the active matrix circuit was formed out of the aluminum film.

Then, using the gate electrodes 804 and 806 as a mask, the gate oxide film in the portions of the P-channel TFTs for the peripheral circuit and for the active matrix circuit was selectively removed to expose the semiconductor layer. Subsequently, a silicon nitride film 808 having a thickness of 100 to 2000 Å, preferably 200 to 1000 Å, e.g., 600 Å, was formed by plasma-assisted CVD.

The active matrix circuit region was masked with photoresist 807. Using the gate electrode 804 as a mask, phosphorus ions were implanted by ion doping to form heavily doped P-type regions 809. The dose was 1×10$^{15}$ atoms/cm$^2$. The accelerating voltage was 20 keV. During this doping process, the accelerating voltage was low. Therefore, phosphorus ions were not implanted into the N-channel TFT regions coated with the gate oxide film 803 (FIG. 8(A)).

Then, phosphorus ions were implanted at a low concentration by ion doping. The dose was 1×10$^{13}$ atoms/cm$^2$. The accelerating voltage was 80 kV. As a result, lightly doped N-type regions 810 were created in the regions of the N-channel TFTs (FIG. 8(B)).

In the illustrated example, the ions were implanted after removing the photoresist mask 807. The ion implantation may be made while leaving the photoresist. Since the phosphorus ions are accelerated at a high voltage, if ion implantation is done while leaving the photoresist, then the phosphorus ions are not implanted into the active matrix circuit regions. Therefore, ideal offset P-channel TFTs are obtained. However, as a result of the ion implantation, the photoresist is carbonized. It may be laborious to remove this carbonized photoresist.

Even if the photoresist is removed, the phosphorus concentration exhibits peaks under the semiconductor region in the form of islands, because the accelerating voltage for phosphorus is high. However, it is not assured that phosphorus ions are not implanted at all. Rather, a trace amount of phosphorus is introduced into the semiconductor region. Even if phosphorus is implanted in this way, the concentration is quite low. Furthermore, a structure given by P+ (source), N−, I (channel)/N−, P+ (drain) is formed. This is best suited for a TFT for an active matrix circuit that is required to reduce its leakage current.

Then, a silicon oxide film was deposited to a thickness of 4000 to 8000 Å by plasma-assisted CVD. Side walls 811, 812, and 813 of silicon oxide were formed on the side surfaces of the gate electrode (FIG. 8(C)).

Thereafter, boron ions were again implanted by ion doping. In this case, the dose is preferably approximate to the dose used in the step illustrated in FIG. 8(A). In the present example, the dose was 1×10$^{15}$ atoms/cm$^2$. The accelerating voltage was 20 keV. Since the accelerating voltage was low, the boron ions were not implanted into the N-channel TFT regions on which the gate oxide film 803 existed. The boron ions were chiefly implanted into the source/drain regions of the P-channel TFTs of the peripheral circuit and of the active matrix circuit. As a result, source/drain regions 814 of the TFT of the active matrix circuit were created. In each of these TFTs, the gate electrode is remote from the source/drain regions, i.e., the offset structure (FIG. 8(D)).

Then, phosphorus ions were implanted. Preferably, the dose is one to three orders of magnitude higher than the dose used in the step illustrated in FIG. 8(B). In the present example, the dose was 50 times as high as the dose of the phosphorus ions first implanted, i.e., 5×10$^{14}$ atoms/cm$^2$. The accelerating voltage was 80 kV. As a result, regions 815 heavily doped with phosphorus were created. Lightly doped drain (LDD) regions 816 were formed under the side walls.

On the other hand, in the P-channel TFT regions, many of the phosphorus ions were implanted into the buffer layer. The conductivity type was not affected greatly (FIG. 8(E)).

After the ion implantation, the laminate was irradiated with KrF excimer laser light having a wavelength of 248 nm and a pulse width of 20 nsec to activate the implanted dopant. The energy density of the laser light was 200 to 400 mJ/cm$^2$, preferably 250 to 300 mJ/cm$^2$.

Figure 8A:
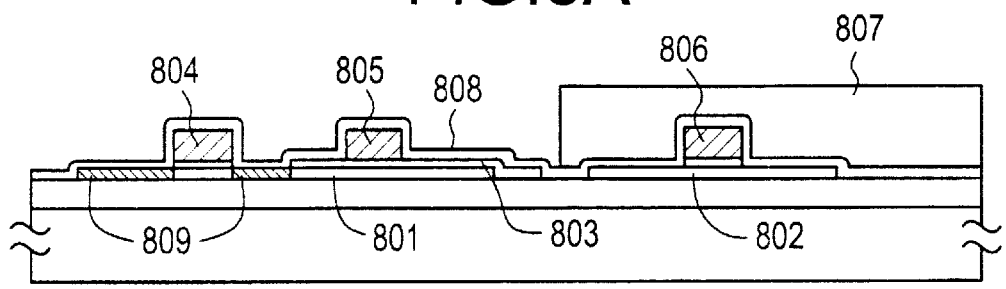
FIGS. 8(A)–8(G) are cross sectional views for showing the manufacturing method in accordance with Example 7 of the present invention.
Figure 8B:
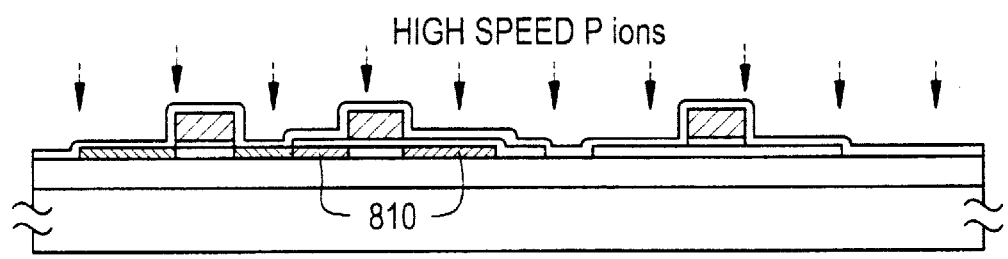
Figure 8C:
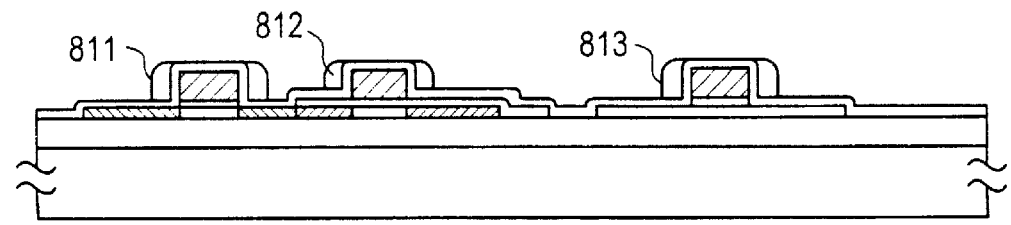
Figure 8D:
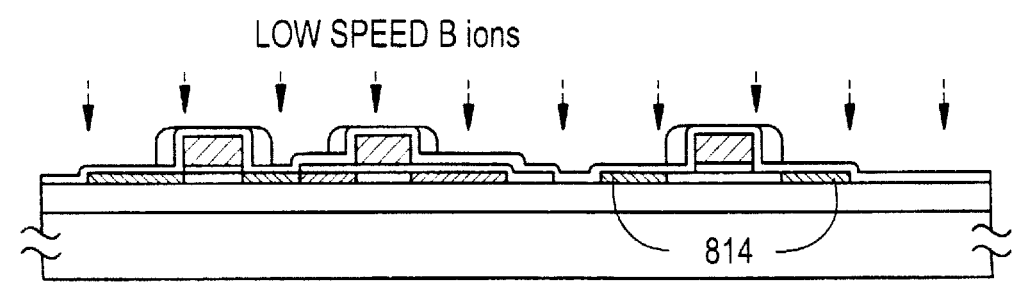
Figure 8E:
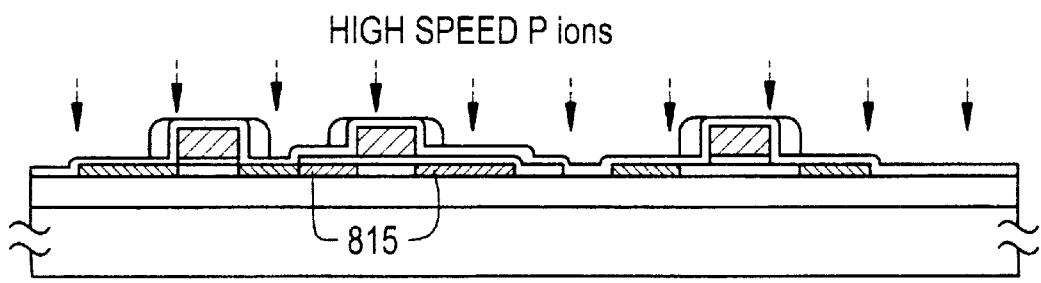
Figure 8F:
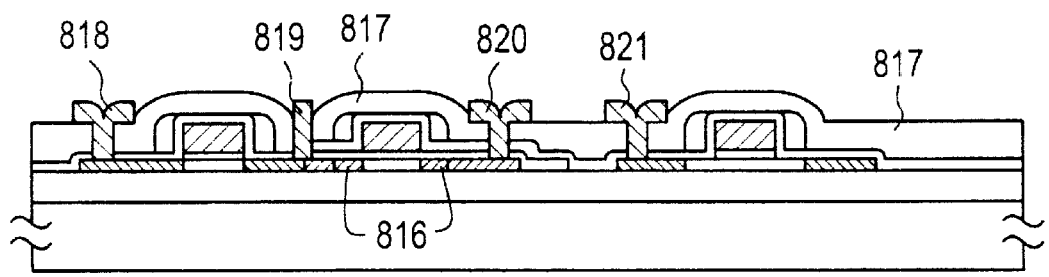
Figure 8G:
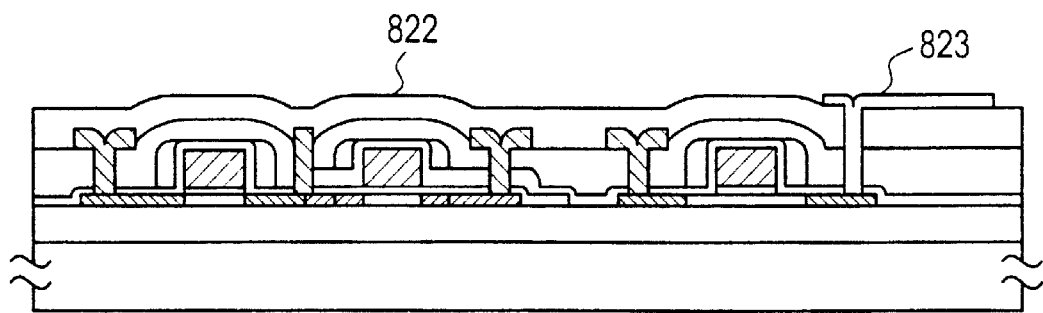

Then, as shown in FIG. 8(F), silicon oxide was deposited as a first interlayer insulator layer 817 to a thickness of 5000 Å over the whole surface by CVD. Contact holes were created in the source/drain regions of the TFTs. Aluminum electrodes and aluminum wiring 818, 819, 820, and 821 were created. Peripheral circuit regions were formed by the manufacturing steps described above.

Silicon oxide was deposited as a second interlayer insulator layer 822 to a thickness of 3000 Å by CVD. This was etched, and contact holes were created. Pixel electrodes 823 were formed out of transparent conductive film in TFTs of an active matrix circuit. In this way, an active matrix liquid crystal display device was fabricated (FIG. 8(G)).

In the present invention, the thickness of the second wiring can be made to approximate the thickness of the gate electrodes and gate wiring. More specifically, the thickness of the second wiring can be equal to the thickness of the gate electrodes and gate wiring ±1000 Å. This is well suited to an active matrix circuit for a liquid crystal display whose plates are required to be less uneven.

While the preferred embodiments of the invention have been described, it is to be understood that various modifications may be made by those ordinary skilled in the art. For example, before forming a silicon nitride film on a gate electrode, it is possible to form an oxide layer on the gate electrode by anodic oxidation.

What is claimed is:

1. A semiconductor device having at least one thin film transistor, said semiconductor device comprising:

an insulating surface having a first portion and a second portion;

a semiconductor layer formed on said first portion of said insulating surface;

a first insulating film formed on said semiconductor layer and said second portion of said insulating surface;

a first wiring formed over said insulating surface, wherein said first wiring includes a gate electrode;

a side wall spacer comprising an insulating material formed adjacent to side surfaces of said first wiring;

an interlayer insulating film formed over said first insulating film, said first wiring and said side wall spacer; and a second wiring formed over said interlayer insulating film and crossing over said side wall spacer and said first wiring, wherein said second wiring connects to at least one of a source region and a drain region of said semiconductor layer, and wherein a second insulating film is interposed between said side wall spacer and said first wiring and between said first insulating film and said interlayer insulating film.

2. The semiconductor device of claim 1 wherein said first and second wiring comprise aluminum.

3. The semiconductor device of claim 1 wherein said side wall spacer is anisotropically etched insulating material comprising silicon oxide.

4. The semiconductor device of claim 1 wherein a thickness x (Å) of said second wiring and a thickness y (Å) of said first wiring satisfies following equation:

$$y-1000 \text{ (Å)} \leq x \leq y+1000 \text{ (Å)}.$$

5. The semiconductor device of claim 1 wherein a material of said second insulating film has a different etching rate from the insulating material of said side wall spacer.

6. The semiconductor device of claim 5 wherein said second insulating film comprises silicon nitride.

7. A semiconductor device having at least one thin film transistor, said semiconductor device comprising:

a semiconductor film formed on an insulating surface and having at least source, drain and channel regions therein;

a gate electrode formed over said channel region with a gate insulating film interposed therebetween, said gate electrode being contained in a first wiring;

a side wall spacer formed adjacent to side surfaces of said first wiring; an interlayer insulating film formed over said gate insulating film, said first wiring and said side wall spacer;

a second wiring formed over said interlayer insulating film and crossing over said side wall spacer and said first wiring; and a second insulating film interposed between said side wall spacer and said side surfaces of said first wiring, wherein said second insulating film extends below said side wall spacer and an etching rate of said second insulating film is different from said side wall spacer, and wherein an upper surface of said first wiring is exposed from said second insulating film.

8. A semiconductor device having at least one thin film transistor, said semiconductor device comprising:

a semiconductor film formed on an insulating surface and having at least source, drain and channel regions therein;

a gate electrode formed over said channel region with a gate insulating film interposed therebetween, said gate electrode being contained in a first wiring;

a side wall spacer formed adjacent to side surfaces of said first wiring; an interlayer insulating film formed over said gate insulating film, said first wiring and said side wall spacer;

a second wiring formed over said interlayer insulating film and crossing over said side wall spacer and said first wiring; and a second insulating film interposed between said side wall spacer and said side surfaces of said first wiring, wherein said second insulating film extends below said side wall spacer so that said second insulating film is interposed between said side wall spacer and said gate insulating film, and an etching rate of said second insulating film is different from said side wall spacer, and wherein an upper surface of said first wiring is exposed from said second insulating film.

9. A semiconductor device having at least one thin film transistor, said semiconductor device comprising:

a semiconductor film formed on an insulating surface and having at least source, drain, and channel regions therein;

a gate electrode formed over said channel region with a gate insulating film interposed therebetween, said gate electrode being contained in a first wiring;

a side wall spacer formed adjacent to side surfaces of said first wiring;

at least one LDD region in said semiconductor film below said side wall spacer;

an interlayer insulating film formed over said gate insulating film, said first wiring and said side wall spacer;

a second wiring formed over said interlayer insulating film and crossing over said side wall spacer and said first wiring; and a second insulating film interposed between said side wall spacer and said side surfaces of said first wiring, wherein said second insulating film extends below said side wall spacer and an etching rate of said second insulating film is different from said side wall spacer, and wherein an upper surface of said first wiring is exposed from said second insulating film.

10. The semiconductor device according to claim 7 wherein said second insulating film comprises silicon nitride.

11. The semiconductor device according to claim 8 wherein said second insulating film comprises silicon nitride.

12. The semiconductor device according to claim 9 wherein said second insulating film comprises silicon nitride.

13. A semiconductor device comprising:
   a semiconductor region having at least source, drain and channel regions therein;
   a gate electrode formed over said channel region with a gate insulating film interposed therebetween, said gate electrode being contained in a first wiring;
   a side wall spacer formed adjacent to side surfaces of said first wiring;
   an interlayer insulating film formed over said gate insulating film, said first wiring and said side wall spacer;
   a second wiring formed over said interlayer insulating film and crossing over said side wall spacer and said first wiring; and
   a second insulating film interposed between said sidewall spacer and said side surfaces of said first wiring,
   wherein said second insulating film extends below said side wall spacer, and
   wherein an upper surface of said first wiring is exposed from said second insulating film.

14. The semiconductor device of claim 13 wherein said first and second wiring comprise aluminum.

15. The semiconductor device of claim 13 wherein said side wall spacer is anisotropically etched insulating material comprising silicon oxide.

16. The semiconductor device of claim 13 wherein said second insulating film has a different etching rate from said gate insulating film.

17. The semiconductor device of claim 13 wherein said second insulating film comprises silicon nitride.

18. A semiconductor device comprising:
   a semiconductor region having at least source, drain and channel regions therein;
   a gate electrode formed over said channel region with a gate insulating film interposed therebetween, said gate electrode being contained in a first wiring;
   a side wall spacer formed adjacent to side surfaces of said first wiring;
   a second insulating film interposed between said sidewall spacer and said side surfaces of said first wiring, wherein said second insulating film extends below said side wall spacer;
   an interlayer insulating film formed over said gate insulating film, said first wiring and said side wall spacer; and
   a second wiring formed over said interlayer insulating film and crossing over said side wall spacer and said first wiring, wherein said second wiring connects to at least one of said source region, and said drain region of said semiconductor region,
   wherein said second insulating film has a different etching rate from said gate insulating film.

19. The semiconductor device of claim 18 wherein said first and second wiring comprise aluminum.

20. The semiconductor device of claim 18 wherein said side wall spacer is anisotropically etched insulating material comprising silicon oxide.

21. The semiconductor device of claim 18 wherein said second insulating film has a different etching rate from said side wall spacer.

22. The semiconductor device of claim 18 wherein said second insulating film comprises silicon nitride.

23. A semiconductor device comprising:
   a semiconductor region having at least source, drain and channel regions therein;
   a gate electrode formed over said channel region with a gate insulating film interposed therebetween, said gate electrode being contained in a first wiring;
   a side wall spacer formed adjacent to side surfaces of said first wiring;
   a second insulating film interposed between said sidewall spacer and said side surfaces of said first wiring, wherein said second insulating film extends below said side wall spacer so that said second insulating film is interposed between said side wall spacer and said gate insulating film;
   an interlayer insulating film formed over said gate insulating film, said first wiring and said side wall spacer; and
   a second wiring formed over said interlayer insulating film and crossing over said side wall spacer and said first wiring, wherein said second wiring connects to at least one of said source region, and said drain region of said semiconductor region,
   wherein said second insulating film has a different etching rate from said gate insulating film.

24. The semiconductor device of claim 23 wherein said first and second wiring comprise aluminum.

25. The semiconductor device of claim 23 wherein said side wall spacer is anisotropically etched insulating material comprising silicon oxide.

26. The semiconductor device of claim 23 wherein said second insulating film has a different etching rate from said side wall spacer.

27. The semiconductor device of claim 23 wherein said second insulating film comprises silicon nitride.

28. A semiconductor device comprising:
   a semiconductor region having at least source, drain and channel regions therein;
   a gate electrode formed over said channel region with a gate insulating film interposed therebetween, said gate electrode being contained in a first wiring;
   a side wall spacer formed adjacent to side surfaces of said first wiring;
   a second insulating film interposed between said sidewall spacer and said side surfaces of said first wiring, wherein said second insulating film extends below said side wall spacer, and wherein an upper surface of said first wiring is exposed from said second insulating film;
   an interlayer insulating film formed over said gate insulating film, said first wiring and said side wall spacer; and
   a second wiring formed over said interlayer insulating film and crossing over said side wall spacer and said first wiring, wherein said second wiring connects to at least one of said source region, and said drain region of said semiconductor region.

29. The semiconductor device of claim 28 wherein said first and second wiring comprise aluminum.

30. The semiconductor device of claim 28 wherein said side wall spacer is anisotropically etched insulating material comprising silicon oxide.

31. The semiconductor device of claim 28 wherein said second insulating film has a different etching rate from said gate insulating film.

32. The semiconductor device of claim 28 wherein said second insulating film comprises silicon nitride.

* * * * *